US012635584B2

(12) United States Patent
Dutta et al.

(10) Patent No.: US 12,635,584 B2
(45) Date of Patent: *May 19, 2026

(54) THREE-DIMENSIONAL INTEGRATED CIRCUIT WITH TOP CHIP INCLUDING SCHOTTKY DIODE BODY CONTACT

(71) Applicant: GlobalFoundries U.S. Inc., Malta, NY (US)

(72) Inventors: Anupam Dutta, Kolkata (IN); Satyasuresh Vvss Choppalli, Bangalore (IN); Rui Tze Toh, Singapore (SG); Mei Hui June Goh, Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 385 days.

This patent is subject to a terminal disclaimer.

(21) Appl. No.: 18/340,230

(22) Filed: Jun. 23, 2023

(65) Prior Publication Data

US 2024/0429208 A1     Dec. 26, 2024

(51) Int. Cl.
*H10W 90/00*          (2026.01)
*H10W 80/00*          (2026.01)

(52) U.S. Cl.
CPC .......... *H10W 90/00* (2026.01); *H10W 80/312* (2026.01); *H10W 80/327* (2026.01); *H10W 90/792* (2026.01)

(58) Field of Classification Search
None
See application file for complete search history.

(56) References Cited

U.S. PATENT DOCUMENTS

| | | | |
|---|---|---|---|
| 5,314,841 A | 5/1994 | Brady et al. | |
| 5,930,605 A | 7/1999 | Mistry et al. | |
| 6,864,156 B1 | 3/2005 | Conn | |
| 8,409,989 B2 | 4/2013 | Pei et al. | |
| 2002/0115244 A1 | 8/2002 | Park et al. | |
| 2011/0193166 A1 | 8/2011 | Liang et al. | |
| 2015/0054149 A1 | 2/2015 | Purushothaman et al. | |
| 2019/0348514 A1 | 11/2019 | Ellis-Monaghan | |
| 2020/0185397 A1* | 6/2020 | Chibvongodze ....... | H10B 43/35 |
| 2020/0259018 A1* | 8/2020 | Rami ..................... | H10D 30/43 |

(Continued)

OTHER PUBLICATIONS

U.S. Appl. No. 18/340,220, Office Action dated Aug. 29, 2025, 10 pages.

(Continued)

*Primary Examiner* — Michael Lebentritt
(74) *Attorney, Agent, or Firm* — Francois Pagette; Hoffman Warnick LLC

(57)          ABSTRACT

Disclosed structures and methods include a top chip flipped relative to a bottom chip and bonded thereto. On the top chip, dielectric material layers separate a transistor from the bottom chip. The transistor includes source and drain regions, a body region on a channel region between the source and drain regions, and a gate structure adjacent to and between the channel region and the dielectric material layers. An insulator layer is on the transistor opposite the dielectric material layers and includes an opening extending to the body region. Optionally, a semiconductor layer is at the bottom of the opening. A contact extends into the opening to the body region (or to the semiconductor layer thereon, if applicable).

20 Claims, 13 Drawing Sheets

(56)         References Cited

U.S. PATENT DOCUMENTS

2020/0328186 A1\*  10/2020  Liu ......................... H01L 25/18
2021/0167180 A1\*  6/2021   Kar ..................... H10D 62/159
2023/0307283 A1\*  9/2023   Or-Bach .............. H01L 23/544

OTHER PUBLICATIONS

U.S. Appl. No. 18/340,220, Application as filed Jun. 22, 2023, 60 pages.
Luo et al. "A Tunnel Diode Body Contact Structure for High-Performance SOI MOSFETs," IEEE Transactions on Electron Devices, vol. 59, No. 1, Jan. 2012, pp. 101-107.
Narayanan et al., "Analysis of Kink Reduction in SOI MOSFET Using Selective Back Oxide Structure," Hindawi Publishing Corporation, Active and Passive Electronic Components, vol. 2012, Article ID 565827, 9 pages.
Kuehne et al., "SOI MOSFET with Buried Body Strap by Wafer Bonding," IEEE Transactions on Electron Devices, vol. 45, No. 5, May 1998, pp. 1084-1091.
U.S. Appl. No. 18/340,220, Amendment to Office Action filed Nov. 4, 2025, 14 pages.
U.S. Appl. No. 19/419,400, Application as filed titled: "Three-Dimensional Integrated Circuit With Top Chip Including Local Interconnect for Body-Source Coupling," 61 pages.
U.S. Appl. No. 18/340,220, 312 Amendment filed Dec. 15, 2025, 11 pages.
U.S. Appl. No. 18/340,220, Notice of Allowance dated Dec. 4, 2025, 13 pages.

\* cited by examiner

FIG. 1.1A

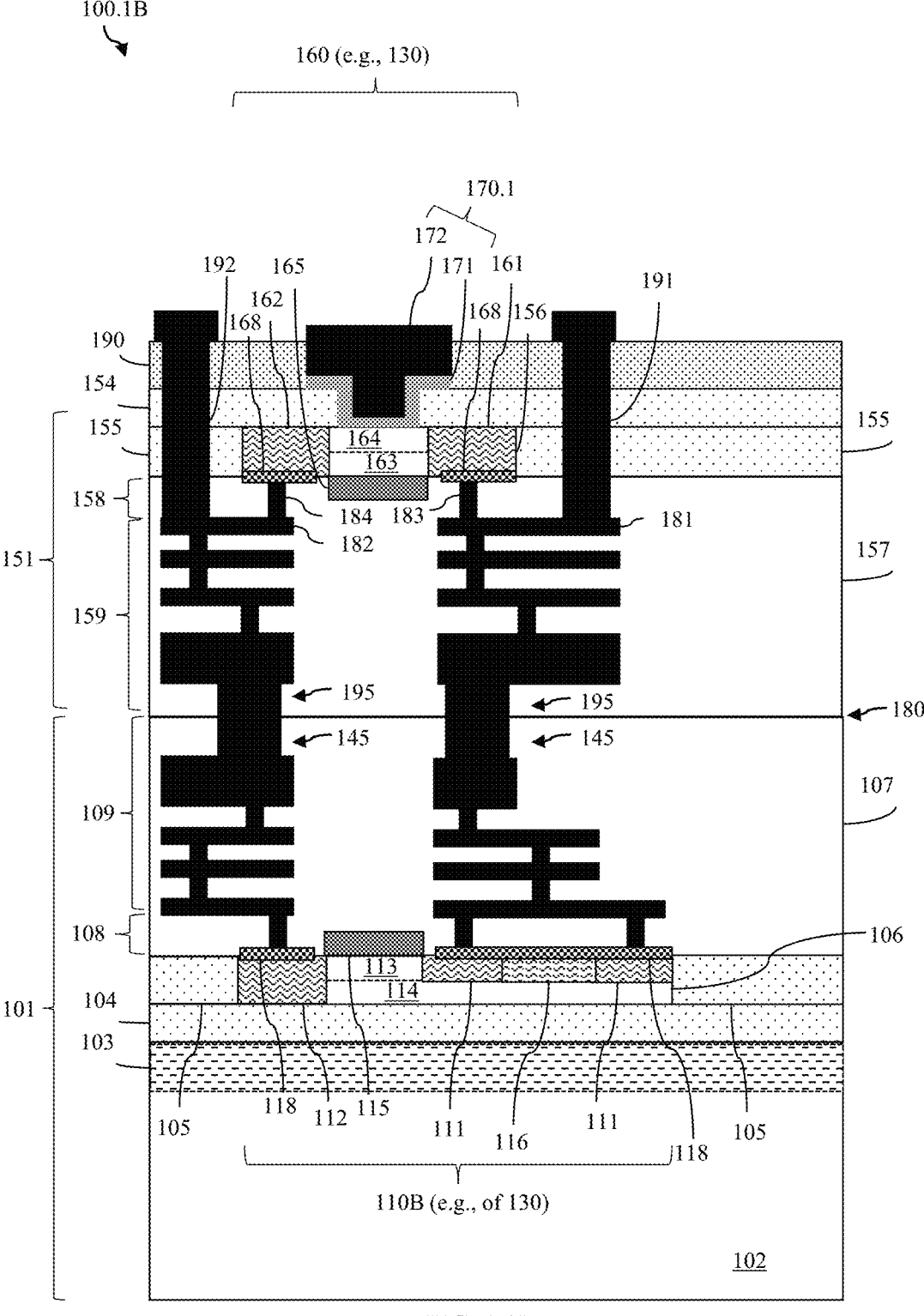
FIG. 1.1B

100.2A
160 (e.g., of 130)
170
172
192  165
162|175
171  161
168  156
191
190
154
155
155
158
151
159
164
163
181
183
184
182
157
195
195
180
145
145
109
107
108
113
114
195
195
101
104
103
105  118  112  115  118  111  106  105
110A (e.g., of 130)
102
FIG. 1.2A

FIG. 1.2B

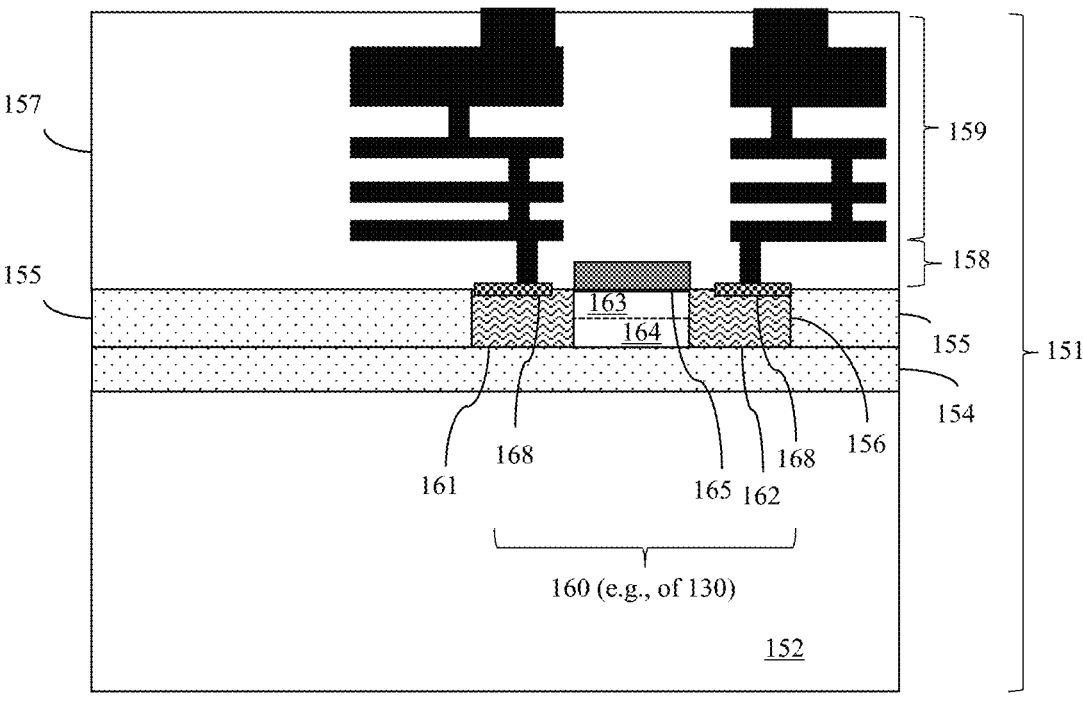
FIG. 2.1

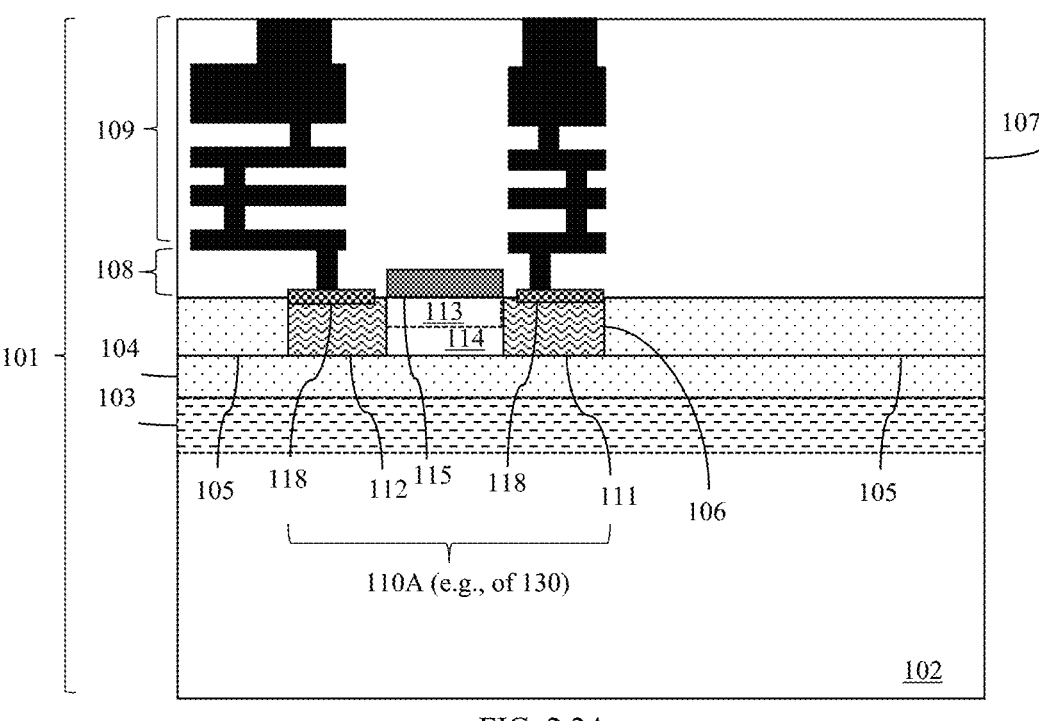
FIG. 2.2A
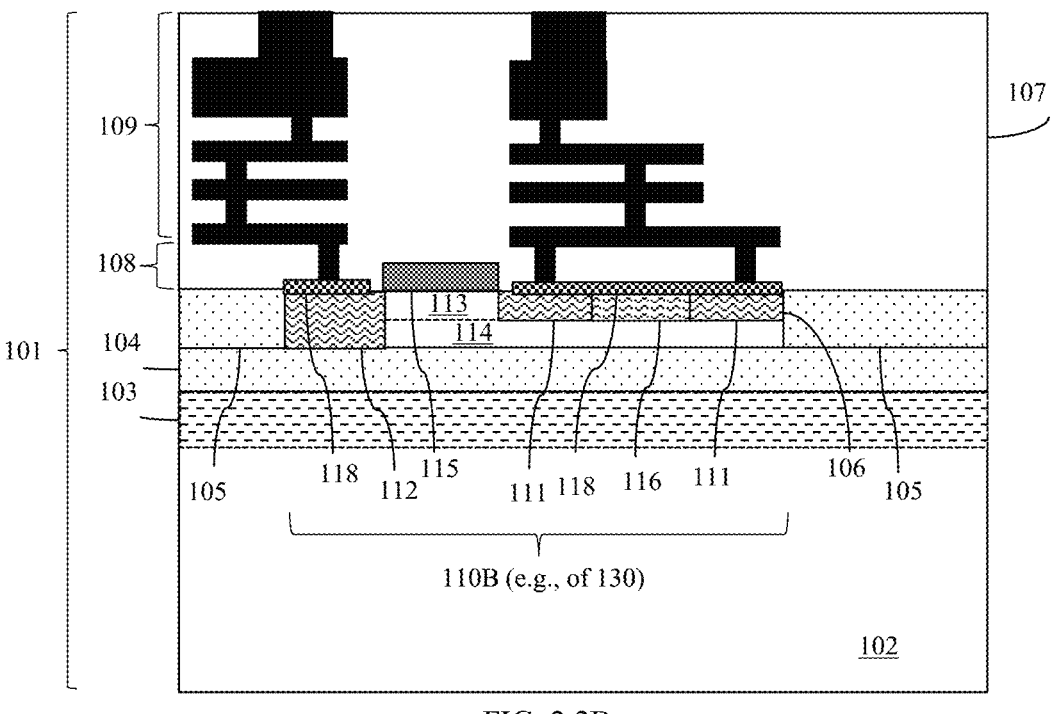
FIG. 2.2B

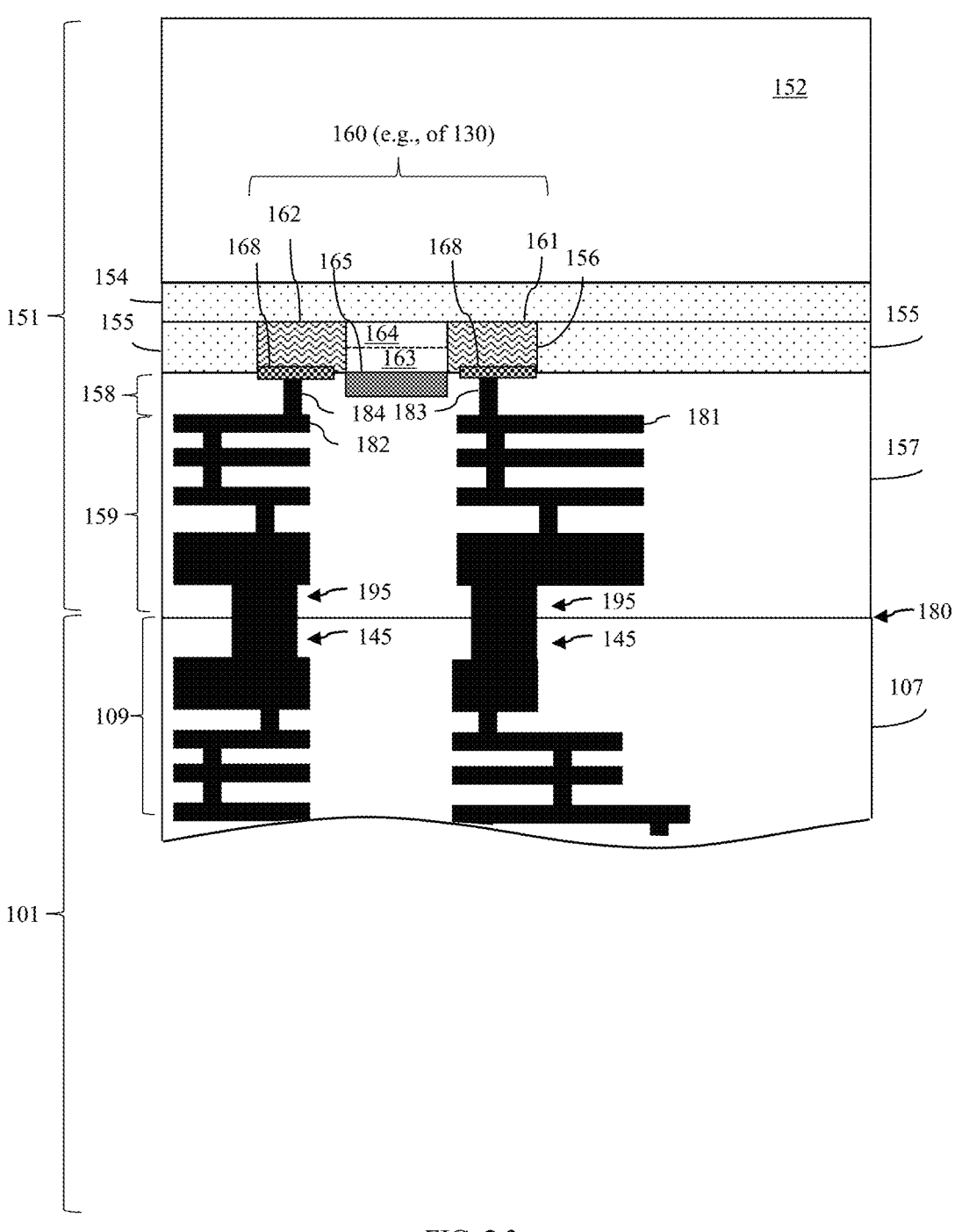
FIG. 2.3

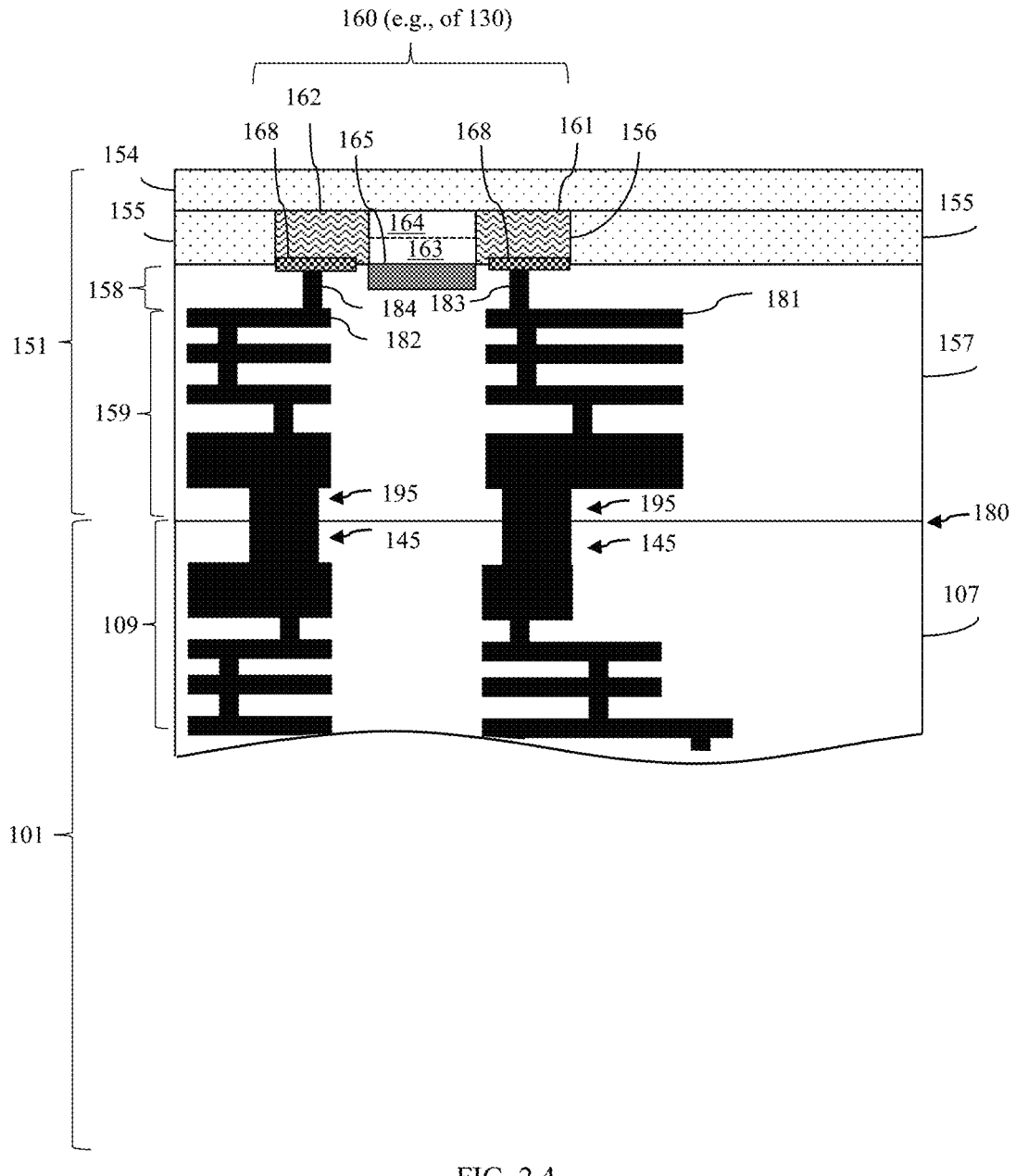
FIG. 2.4

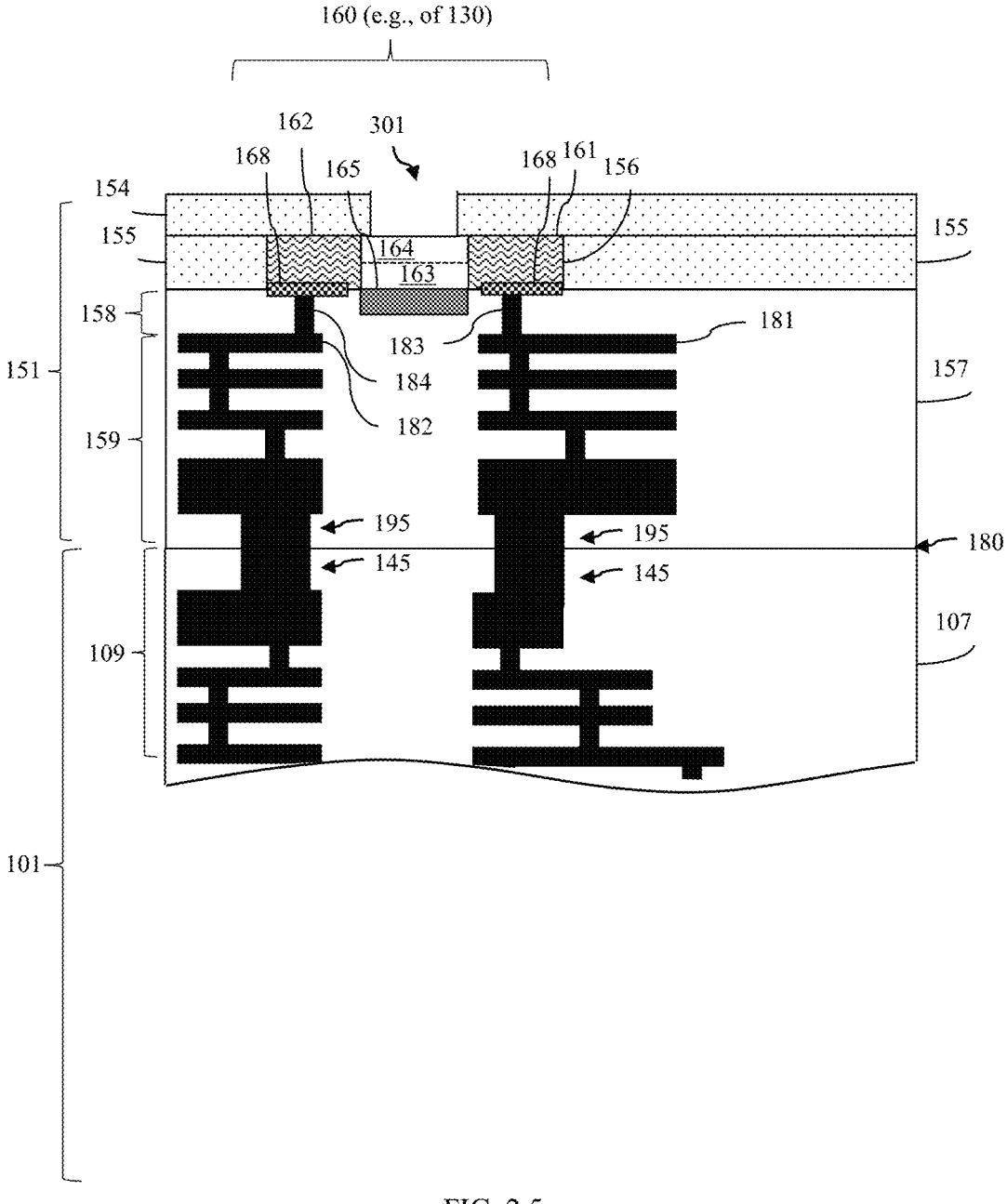
FIG. 2.5

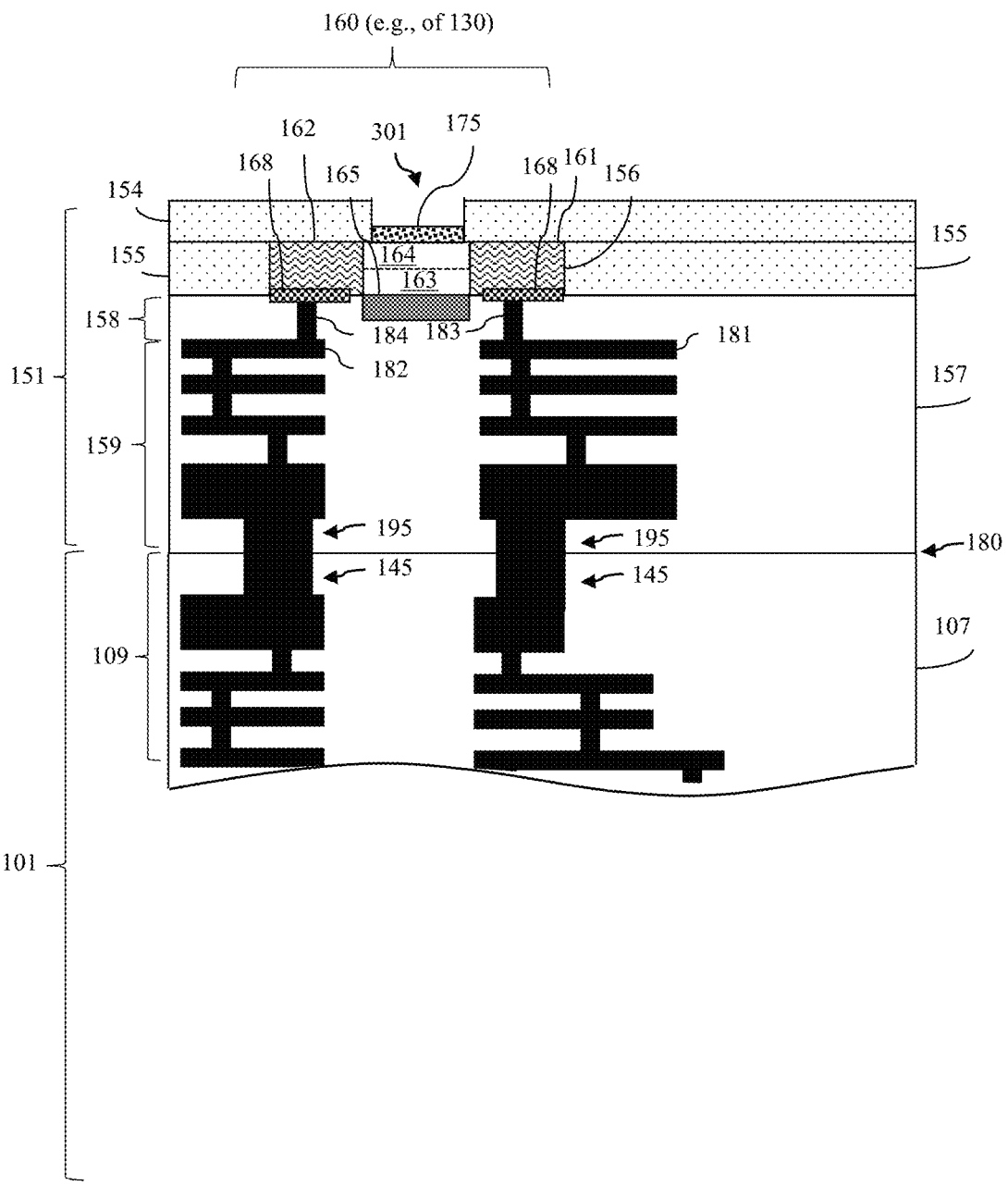
FIG. 2.6

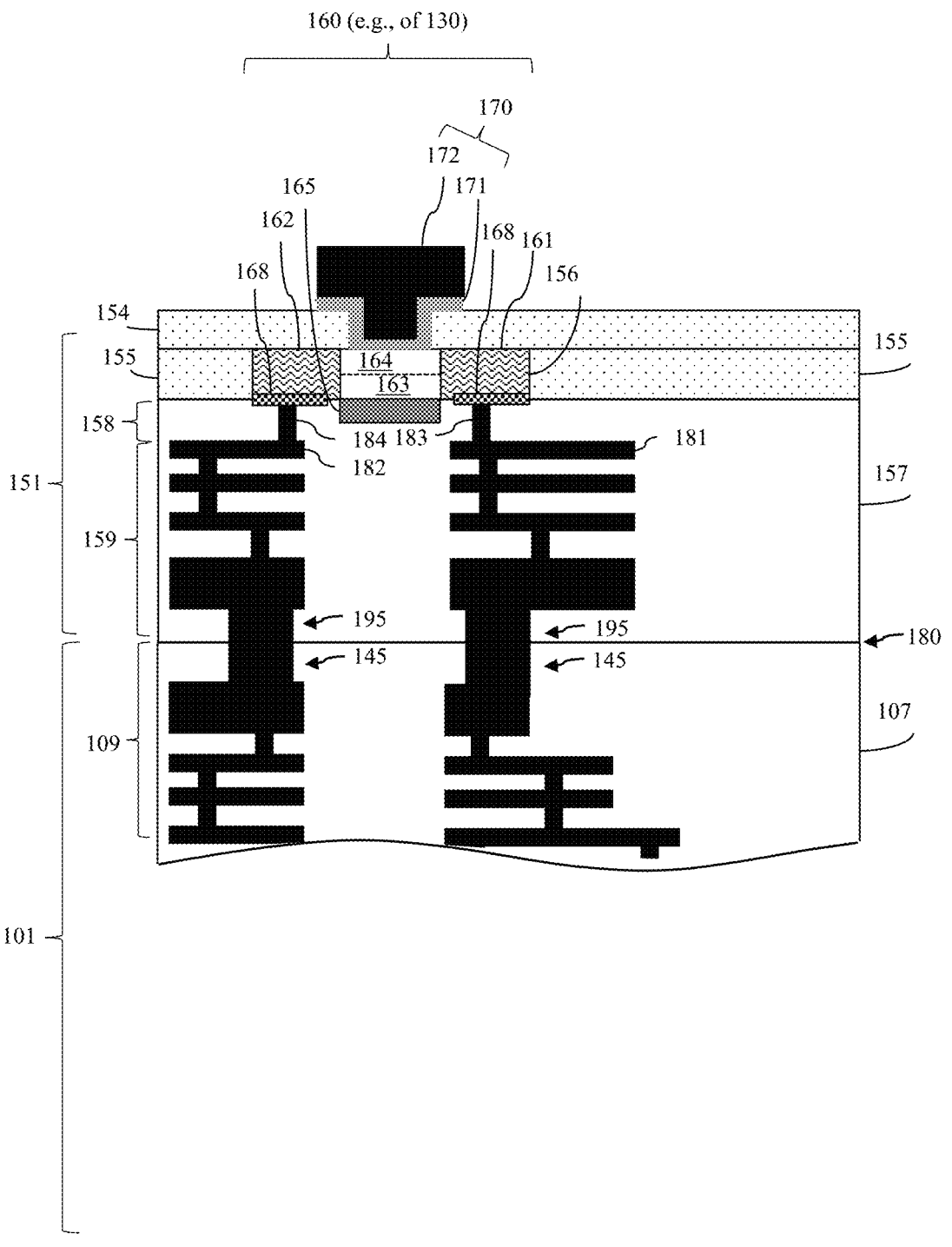
FIG. 2.7

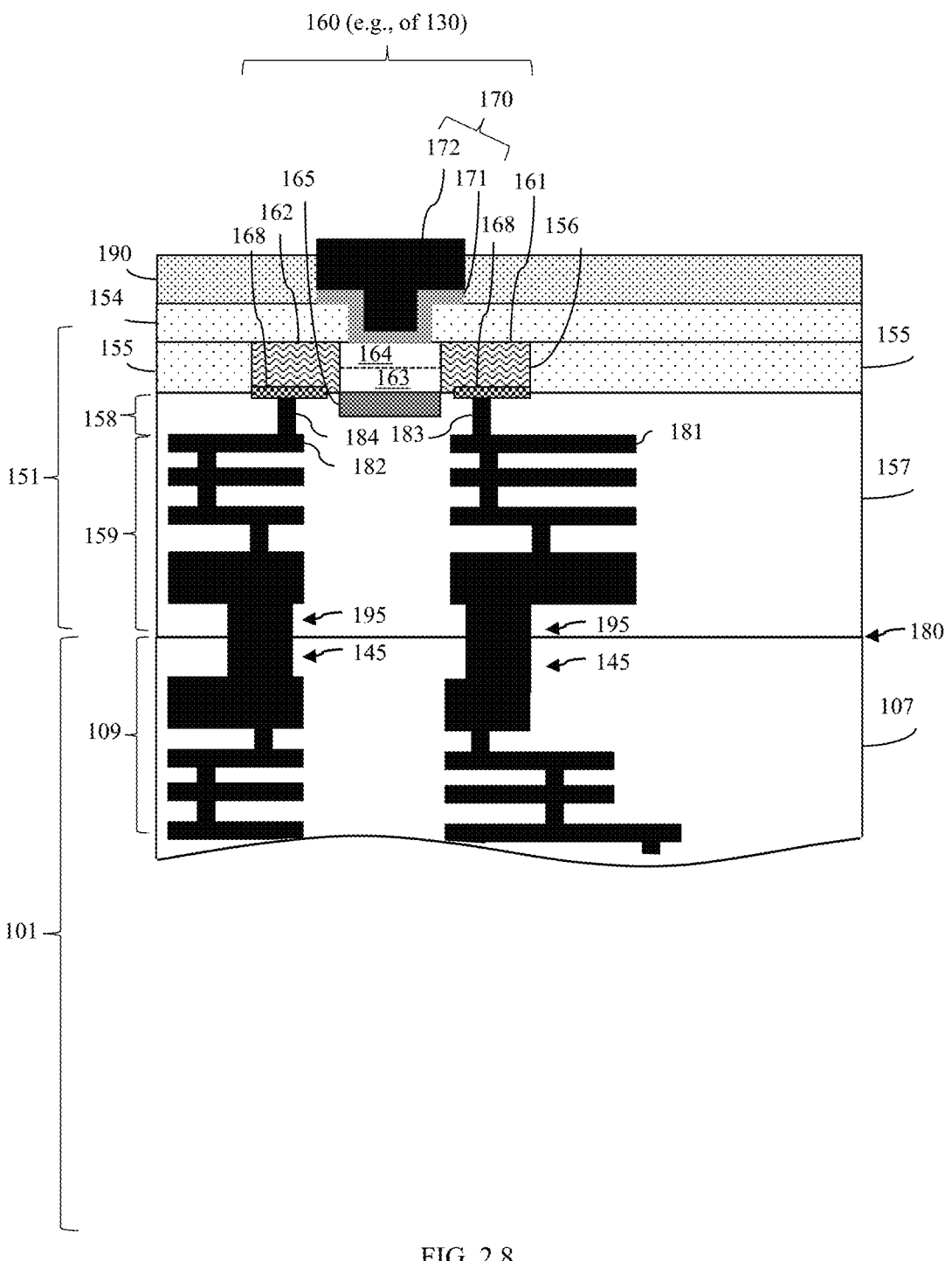
FIG. 2.8

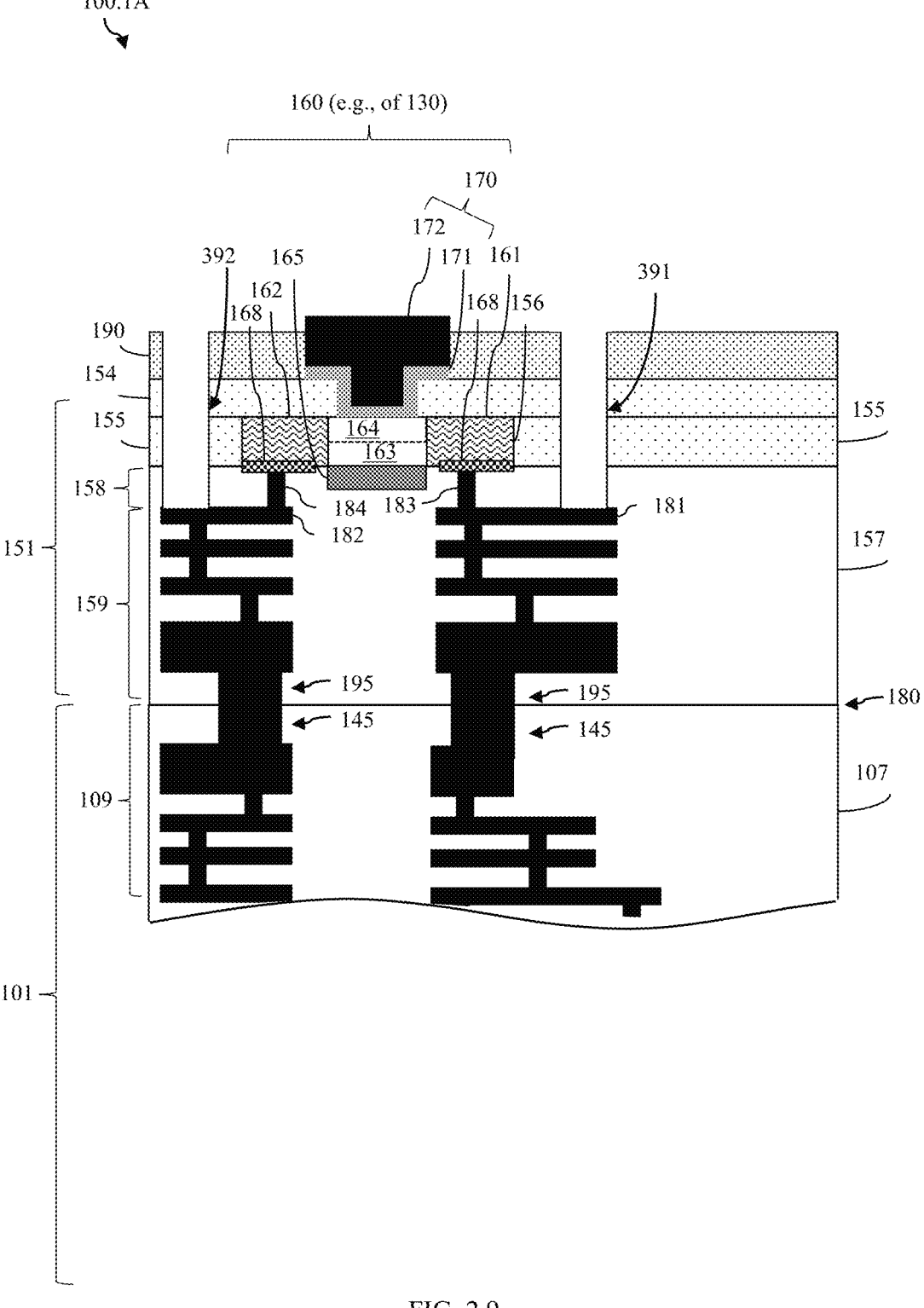
FIG. 2.9

THREE-DIMENSIONAL INTEGRATED CIRCUIT WITH TOP CHIP INCLUDING SCHOTTKY DIODE BODY CONTACT

BACKGROUND

The present disclosure relates three-dimensional (3D) integrated circuits (ICs) and, more particularly, a 3DIC structure and method of forming the 3DIC structure.

3DICs have been developed that include, for example, at least two chips (e.g., a bottom chip and a top chip) stacked vertically and electrically connected. Such 3DICs reduce two-dimensional (2D) area consumption of a chip package with just a slight increase in chip package thickness. However, the available area for making electrical connections to device components within the chips may be reduced.

SUMMARY

Disclosed herein are embodiments of an IC structure and, particularly, a 3DIC. In some embodiments, the structure can include a first chip (also referred to herein as a top chip) stacked on a second chip (also referred to herein as a bottom chip). The first chip can include first dielectric material layers adjacent to the second chip and, more particularly, adjacent to second dielectric materials of the second chip. The first chip can further include a first insulator layer and a first transistor between the first dielectric material layers and the first insulator layer. The first transistor can include: a first source region; a first drain region; a first channel region; a first body region on the first channel region, wherein the first channel region and the first body region are positioned laterally between the first source region and the first drain region; and a first gate structure between the first dielectric material layers and the first channel region. The first chip can further include a contact within the first insulator layer and immediately adjacent to the first body region.

In other embodiments, the structure can similarly include a first chip stacked on a second chip. The first chip can include first dielectric material layers adjacent to the second chip and, more particularly, adjacent to second dielectric materials of the second chip. The first chip can further include a first insulator layer and a first transistor between the first dielectric material layers and the first insulator layer. The first transistor can include: a first source region; a first drain region; a first channel region; a first body region on the first channel region, wherein the first channel region and the first body region are positioned laterally between the first source region and the first drain region; and a first gate structure between the first dielectric material layers and the first channel region. In these embodiments, an opening can extend through the first insulator layer to the first body region, an additional semiconductor layer can be within the opening immediately adjacent to the first body region, and a contact can be within the opening on the additional semiconductor layer.

Also disclosed herein are embodiments of a method of forming the disclosed semiconductor structures. In some embodiments, the method can include forming a first chip, forming a second chip, and stacking the first chip on the second chip. The stacked first chip can include first dielectric material layers adjacent to the second chip, a first insulator layer, and a first transistor between the first dielectric material layers and the first insulator layer. The first transistor can include: a first source region; a first drain region; a first channel region; a first body region on the first channel region, wherein the first channel region and the first body region are positioned laterally between the first source region and the first drain region; and a first gate structure between the first dielectric material layers and the first channel region. The method can further include forming an opening that extends through the first insulator layer to the first body region and forming a contact within the opening.

BRIEF DESCRIPTION OF THE DRAWINGS

The present disclosure will be better understood from the following detailed description with reference to the drawings, which are not necessarily drawn to scale and in which:

FIGS. 1.1A, 1.1B, 1.2A, and 1.2B are cross-section diagrams illustrating disclosed 3DIC structure embodiments, respectively;

FIG. 2.1 is a cross-section diagram illustrating a first chip formed according to disclosed method embodiments;

FIGS. 2.2A and 2.2B are cross-section diagram illustrating alternative second chips formed according to disclosed method embodiments; and FIGS. 2.3-2.9 are cross-section diagram illustrating partially semiconductor structures including first and second chips and formed according to disclosed method embodiments.

DETAILED DESCRIPTION

As mentioned above, 3DICs have been developed that include, for example, at least two chips (e.g., a bottom chip and a top chip) stacked vertically and electrically connected. Components of a given IC design are divided between the two chips. For example, transistors of different devices can be on the same or different chips. Transistors of the same multi-transistor device can also be on the same or different chips. The gate structure fingers, and corresponding source/drain regions of a multi-gate structure finger transistor can also be on the same or different chips. The top and bottom chips each have back-end-of-the-line (BEOL) metal levels with the top chip being flipped relative to the bottom chip and the outermost BEOL surfaces bonded together, providing required electrical connections between devices on the two chips. Such 3DICs reduce two-dimensional (2D) area consumption of a chip package with just a slight increase in chip package thickness. However, the available area for making electrical connections to device components is reduced.

In view of the foregoing, disclosed herein are embodiments of a 3DIC structure including a first chip (also referred to herein as a top chip) flipped relative to a second chip (also referred to herein as a bottom chip) and bonded thereto. The first chip can include first dielectric material layers (including, for example, middle of the line (MOL) dielectric material layer(s) and back end of the line (BEOL) dielectric material layers) with an outermost surface of the first dielectric material layers being bonded to an outermost of second dielectric material layers of the second chip. The first chip can further include a first transistor (e.g., a metal oxide semiconductor field effect transistor (MOSFET)) between the first dielectric material layers and a first insulator layer. The first transistor can include: a first source region; a first drain region; positioned laterally between the first source region and the first drain region, a first body region on a first channel region; and a first gate structure between the first dielectric material layers and the first channel region. The first chip can further include an opening that extends through the first insulator layer to the first body region. Optionally, a semiconductor layer can be at the bottom of the opening. A contact can extend through the opening to the first body region or, if applicable, to the semiconductor layer thereon. Also disclosed herein are method embodiments for forming the disclosed 3DIC structures.

FIGS. 1.1A, 1.1B, 1.2A, and 1.2B are cross-section diagrams illustrating embodiments of a 3DIC structure 100.1A, 100.1B, 100.2A, and 100.2B, respectively. Referring to FIGS. 1.1A-1.2B unless otherwise noted, in each of these embodiments, the 3DIC structure 100.1A, 100.1B, 100.2A, 100.2B can include a first chip 151 (also referred to herein as a top chip) and a second chip 101 (also referred to herein as a bottom chip). The first chip 151 can be flipped relative to the second chip 101 and outermost surfaces of BEOL dielectric material layers of the two chips can be bonded together or otherwise connected (see bonded surfaces 180), as discussed in greater detail below.

More particularly, the first chip 151 can include multiple first dielectric material layers 157. As discussed in greater detail below, the first dielectric material layers 157 can include one or more first dielectric material layers in a first middle of the line (MOL) region 158 adjacent to front end of the line (FEOL) device(s). The first MOL region 158 can further include first contacts extending therethrough to the FEOL first device(s). The first dielectric material layers 157 can further include multiple first dielectric material layers in a first back end of the line (BEOL) region 159 adjacent to the first MOL region 158. The first BEOL region 159 can further include first conductive wires and vias required for electrical pathways therein. The second chip 101 can include multiple second dielectric material layers 107. As discussed in greater detail below, the second dielectric material layers 107 can include one or more second dielectric material layers in a second MOL region 108 adjacent to FEOL second device(s). The second MOL region 108 can further include second contacts extending therethrough to the FEOL second device(s). The second dielectric material layers 107 can further include multiple second dielectric material layers in a second BEOL region 109 adjacent to the second MOL region 108. The second BEOL region 109 can further include second conductive wires and vias required for electrical pathways therein.

On each chip 151, 101, MOL dielectric material layers can optionally include a relatively thin conformal etch stop layer (e.g., a relatively thin conformal silicon nitride (SiN) layer or one or more conformal layers of some other suitable etch stop material) covering FEOL device(s). The MOL dielectric material layers can also include a blanket dielectric layer on the etch stop layer. The blanket dielectric layer can be a layer of interlayer dielectric (ILD) material. The ILD material can include, for example, silicon dioxide (SiO$_2$) or any other suitable ILD material, such as borophosphosilicate glass (BPSG), phosphosilicate glass (PSG), etc. The MOL contacts can extend through the MOL dielectric material layers to terminal(s) of FEOL device(s). The BEOL dielectric material layers can be stacked on the MOL dielectric material layer(s) and can include relatively thick ILD material layers for the BEOL metal and via levels within the BEOL region and, optionally, relatively thin dielectric layers (e.g., etch stop layers) therebetween. The first chip 151 can be flipped relative to the second chip 101 stacked thereon, and a first outermost BEOL dielectric material layer of the first chip 151 can be bonded to or otherwise attached to a second outermost BEOL dielectric material layer of the second chip 101 (see bonded surfaces 180).

The first chip 151 can further include a first FEOL region. The first FEOL region can include a first semiconductor layer adjacent to the first dielectric material layers 157 and, particularly, adjacent to an innermost surface of the first dielectric material layers distal to the second chip 101. The first semiconductor layer can include a monocrystalline silicon (Si) layer or a monocrystalline layer of any other suitable semiconductor material. The first FEOL region can further include one or more FEOL devices formed using the first semiconductor layer including, but not limited to, a first transistor 160 (e.g., a metal oxide semiconductor field effect transistor (MOSFET)).

The first transistor 160 can include a first active device region 156 in a portion of the first semiconductor layer. Boundaries of the first active device region 156 can, for example, be defined by first isolation regions 155. First isolation regions 155 can be, for example, first shallow trench isolation (STI) regions in which trenches extends through the first semiconductor layer and are filled with one or more layers of isolation material. Alternatively, the first isolation regions 155 could include portions of the first semiconductor layer doped or otherwise processed to isolate the first active device region 156.

The first active device region 156 can include a first source region 161 and a first drain region 162 positioned laterally adjacent but physically separated therefrom. The first active device region 156 can further include a first channel region 163 within the space between the first source and drain regions 161-162 (i.e., positioned laterally between the first source region 161 and the first drain region 162) and further proximal to the first dielectric material layers 157. The first active device region 156 can also include a first body region 164 within the space between the first source and drain regions 161-162 distal to the first dielectric material layers 157 and, more particularly, above the first channel region 163, as oriented in the figures. The first transistor 160 can further include a first gate structure 165 adjacent to the first channel region 163. Specifically, the first gate structure 165 can be positioned between the innermost surface of the first dielectric material layers 157 and the first active device region 156 at the first channel region 163.

Optionally, first metal silicide layers 168 can be on surfaces of the first source region 161 and the first drain region 162 and, thus, stacked between the first dielectric material layers 157 and the first active device region 156 and positioned laterally adjacent to the first gate sidewall spacers of the first gate structure 165.

The first chip 151 can further include a contact 170 and, in some embodiments, this contact 170 can be a Schottky diode body contact. More specifically, the first chip 151 can further include a first insulator layer 154 (also referred to herein as a first buried insulator layer or a first buried oxide layer) on the first semiconductor layer (and, thus, on the first active device region 156 of the first transistor 160) and further extending over the first isolation regions 155 opposite the first dielectric material layers 157 and the first gate structure 165. An opening can extend completely through the first insulator layer 154 to the first active device region 156 and can specifically be patterned so as to expose a surface of the first body region 164 without further exposing adjacent surfaces of the first source and drain regions 161-162.

Optionally, as illustrated in FIGS. 1.2A-1.2B, an additional semiconductor layer 175 can cover the surface of the first body region 164 at the bottom of the opening (i.e., can fill a lower section of the opening). The additional semiconductor layer 175 can be, for example, an epitaxial semiconductor layer that is monocrystalline or polycrystalline in structure. The semiconductor material of the additional semiconductor layer 175 can be the same semiconductor material as or a different semiconductor material than the first active device region 156. For example, the semiconductor material of the additional semiconductor layer 175 can be monocrystalline or polycrystalline silicon, silicon germanium, silicon carbide, or any other suitable monocrystalline or polycrystalline semiconductor material. In some embodiments, the additional semiconductor layer 175 can have a different type conductivity than the first body region 164, thereby forming a PN diode with the first body region 164. That is, if the first body region 164 is a P-type body region (e.g., in the case of an N-type MOSFET (NFET), as discussed in greater detail below), then the additional semiconductor layer 175 can be an N-type additional semiconductor layer; whereas if the body region 164 is an N-type body region (e.g., in the case of a P-type MOSFET (PFET), again as discussed in greater detail below), then the additional semiconductor layer 175 can be a P-type additional semiconductor layer. In other embodiments, the additional semiconductor layer 175 can have the same type conductivity as the first body region 164 but at a different conductivity level (e.g., at a higher conductivity level).

Contact 170 can have a first portion within the opening and a second portion above the first portion. Furthermore, contact 170 can include one or more metal or metal alloy layers. The metal or metal alloy layers can include, for example, a metallic liner 171 and one or more layers of metallic fill material 172. The metallic liner 171 can include a metallic barrier layer (e.g., a titanium nitride (TiN) layer, a tungsten nitride (WN) layer, a tantalum nitride (TaN) layer, or a layer of any other suitable metal or metal alloy that can provide a diffusion barrier). The metallic fill material 172 could be tungsten (W) or titanium (Ti). Alternatively, the metallic fill material 172 could be tungsten-titanium (W/Ti), gold (Au), nickel-gold (Ni/Au), titanium-platinum-gold (Ti/Pt/Au), or any other suitable metallic fill material(s). In embodiments without the additional semiconductor layer 175 (e.g., as illustrated in FIGS. 1.1A-1.1B), the metallic liner 171 can be immediately adjacent to the first body region 164 at the bottom of the opening, can line the sidewalls of the opening, and can optionally extend over the top edge of the opening onto the first insulator layer 154. The metallic fill material 172 can be on the liner 171.

Contact 170 can have a first portion, which completely fills the opening and is immediately adjacent to the first body region 164 (thereby forming a Schottky diode body contact), and a second portion, which is above the first portion. Optionally, the second portion can be wider than the first portion and, thus, can extend laterally onto the first insulator layer 154 (e.g., so that the contact 170 is T-shape (as illustrated)). In embodiments with the additional semiconductor layer 175 (e.g., as illustrated in FIGS. 1.2A-1.2B) the metallic liner 171 can be immediately adjacent to the additional semiconductor layer 175 (which is in a lower section of the opening adjacent to the first body region 164), can line the sidewalls of an upper section of the opening above the additional semiconductor layer 175 and can optionally extend over the top edge of the opening onto the first insulator layer 154. The metallic fill material 172 can be on the metallic liner 171. Thus, contact 170 can have a first portion within the upper section of the opening above the additional semiconductor layer 175 and a second portion, which is above the first portion. Depending upon the doping of the additional semiconductor layer 175 (as discussed above), the contact 170 is to a PN diode or provides a direct electrical contact to the first body region 164. In any case, optionally, the second portion can be wider than the first portion and, thus, can extend laterally onto the first insulator layer 154 (e.g., so that the contact 170 is T-shape (as illustrated)).

The first chip 151 can further include an additional first insulator layer 190. The additional first insulator layer 190 can be on the first insulator layer 154. The additional first insulator layer 190 can be positioned laterally adjacent to and, more particularly, can laterally surround the second portion of the contact 170 that extends above the first insulator layer 154. Although not illustrated, optionally, the metallic liner 171 can be on vertical surfaces of the metallic fill material 172 of second portion of the contact 170 to separate the metallic fill material 172 from the additional first insulator layer 190 (e.g., to prevent electromigration of metal into the additional first insulator layer 190). The first chip 151 can further include multiple through oxide vias (TOVs), as well as the first contacts within the first MOL region 158, and first conductive wires and vias within the first BEOL region 159, as mentioned above.

The TOVs of the first chip 151 can include, for example, a source via 191 and a drain via 192. The source via 191 and drain via 192 can each extend through the additional first insulator layer 190, through the first insulator layer 154, through first isolation regions 155, and into the first dielectric material layers 157 and, particularly, through the first MOL region 158. The source via 191 and drain via 192 can land on two discrete first conductive wires 181 and 182, respectively, within the first metal level (M1) of the BEOL metal levels of the first BEOL region 159. Two first contacts 183 and 184 can extend from the two first conductive wires 181 and 182 through the first dielectric layers of the first MOL region 158 to the first source region 161 and the first drain region 162, respectively. As illustrated, additional first conductive wires and vias within metal levels M1-Mx of the first BEOL region 159 can provide electrical pathways from the first conductive wires 181 and 182 (and, thereby from the source via 191 and drain via 192, respectively) to the bonded surfaces 180. Although not shown, it should be understood that first contacts in the first MOL region 158 and first conductive wires and vias in the first BEOL region 159 can also provide an electrical pathway to the first gate structure 165.

The first chip 151 can further input/output pads on the additional first insulator layer 190, aligned above the multiple contacts. Additional features of the first chip 151 can include, but are not limited to, a passivation layer on the additional first insulator layer 190. Electrical connections to the input/output pads can be made through openings that extend through the passivation layer to the input/output pads.

The second chip 101 can include a second semiconductor substrate 102. The second chip 101 can further include a second insulator layer 104 (also referred to herein as a second buried insulator layer or a second buried oxide layer) above and immediately adjacent to the semiconductor substrate 102. Optionally, second semiconductor substrate 102 can include a high resistance region 103 (also referred to herein as a trap-rich region) adjacent to the second insulator layer 104. For example, the high resistance region 103 can be a defect region within the semiconductor substrate. This defect region can be polycrystalline or amorphous in structure and can include imperfections in the regular spacing of atoms that make up the semiconductor material. These imperfections form traps and, specifically, locations within the semiconductor substrate that restrict movement of charge carriers (i.e., electrons and holes) so that this defect region is referred to as being a trap-rich region. The presence of these imperfections or traps increases resistance so that this defect region is also referred to as a high resistance region. As discussed in greater detail below regarding the method embodiments, an exemplary technique for forming such a high resistance region 103 within a semiconductor substrate 102 can include implantation of an inert dopant to modify the crystalline structure (e.g., to convert it to an amorphous structure). For purposes of this disclosure, an inert dopant refers to a dopant species that is generally not considered to be chemically reactive (i.e., that is neutral) at least with respect to the particular semiconductor material of the semiconductor substrate, that doesn't completely prevent recrystallization of the doped region during a subsequent rapid thermal anneal process (RTA) (e.g., to create poly and/or monocrystalline region(s)), and that doesn't significantly impact the electrical properties of the resulting poly and/or monocrystalline region(s). Such inert dopants include, but are not limited to, inert gases (also referred to as noble gases) (e.g., argon, xenon, helium, neon, krypton, radon, etc.), silicon, or any other suitable inert dopant. The inert dopant implantation process is followed by a recrystallization anneal during which the amorphized portion begins to recrystallize from the top down and from the bottom up and, as a result, the defect region is formed. Thus, if the second semiconductor substrate 102 includes a high resistance region 103, the inert dopant will be present below, within, and above the high resistance region 103.

The second chip 101 can include a second FEOL region. The second FEOL region can include a second semiconductor layer on the second insulator layer 104. The second semiconductor layer can include a monocrystalline silicon (Si) layer or a monocrystalline layer of any other suitable semiconductor material. The second FEOL region can further include one or more FEOL devices formed using the second semiconductor layer. Optionally, the second device(s) can include any of MOSFET(s), bipolar junction transistor(s) (BJT(s)), diode(s), passive device(s) (e.g., resistors) or any other type of semiconductor device. Optionally, one or more of the FEOL second devices could be electrically connected to the first transistor 160, 260 via electrical pathways established in the first MOL and BEOL regions and the second MOL and BEOL regions.

In some embodiments, a FEOL second device on the second chip 101 can include second transistor (e.g., a MOSFET), such as the second transistor 110A (e.g., of the 3DIC structure 100.1A of FIG. 1.1A and of 3DIC structure 100.2A of FIG. 1.2A) or the second transistor 110B (e.g., of the 3DIC structure 100.1B of FIG. 1.1B and of 3DIC structure 100.2B of FIG. 1.2B). Such a second transistor 110A, 110B can include a second active device region 106. Boundaries of the second active device region 106 can, for example, be defined by second isolation regions 105. Second isolation regions 105 can be second STI regions (e.g., trenches, which extend through the second semiconductor layer, and which are filled with one or more layers of isolation material). Alternatively, the second isolation regions 105 could include portions of the second semiconductor layer doped or otherwise processed to isolate the second active device region 106.

Referring specifically to FIGS. 1.1A and 1.2A, the second transistor 110A can include, within the second active device region 106, a second source region 111, a second drain region 112 and, positioned laterally between the second source region 111 and the second drain region 112, a second body region 114 and a second channel region 113 above the second body region 114. The second transistor 110A can further include a second gate structure 115 on the second active device region 106 adjacent to the second channel region 113. Optionally, the second transistor 110A can further include second metal silicide layers 118 on the second source region 111, on the second drain region 112 and, optionally, on the second gate structure 115 (not shown). Second gate sidewall spacers (not shown) can electrically isolate the second gate structure 115 from the second source region 111, the second drain region 112 and any second metal silicide layers 118 thereon. In the second transistor 110A, the second body region 114 is not contacted for purposes of body biasing such that the second transistor 110A is a floating body (FB) single finger MOSFET.

Referring specifically to FIG. 1.1B and FIG. 1.2B, the second transistor 110B can include, within the second active device region 106, a second source region 111, a second drain region 112, and a second channel region 113 positioned laterally between the second source region 111 and the second drain region 112. Also, within the second active device region 106, the second transistor 110B can include a body contact region 116 (e.g., adjacent to the second source region 111) and a second body region 114 immediately adjacent to the body contact region 116 and further extending laterally below and immediately adjacent to the second source region 111 and the second channel region 113. In some embodiments, the second drain region 112 can extend deeper into the second active device region 106 than the second source region 111 and the body contact region 116. For example, the second drain region 112 can extend from the top surface of the second active device region 106 to the top surface of the second insulator layer 104, as illustrated. The second transistor 110B can further include a second gate structure 115 on the second active device region 106 adjacent to the second channel region 113. Optionally, the second transistor 110B can further include second metal silicide layers 118 on the second source region 111, on the second drain region 112, on the body contact region 116, and, optionally, on the second gate structure 115 (not shown). Second gate sidewall spacers (not shown) can electrically isolate the second gate structure 115 from the second source region 111, the second drain region 112 and any second metal silicide layers 118 thereon. In the second transistor 110B, the second body region 114 can be contacted (via body contact region 116) for purposes of body biasing such that the second transistor 110B is a body-contacted single finger MOSFET. Optionally, in the second transistor 110B, the second source region 111 and body contact region 116 can be electrically connected (e.g., via a local interconnect, such as a second metal silicide layer 118 that extends laterally across the source and body regions and/or via MOL second contacts in the second MOL region 108 and BEOL second conductive wires and/or vias in the second BEOL region 109).

As mentioned above, the second chip 101 can include second dielectric material layers 107. The second dielectric material layers 107 can include second dielectric material layer(s) in the second MOL region 108 and second dielectric material layers in the second BEOL region 109. The second chip 101 can further include second contacts that extend through the second MOL region 108 to the FEOL second devices. For example, the second chip 101 can include second contacts that extend through the second MOL region 108 to the second source region 111, to the second drain region 112, and to the second gate structure (not shown). Second conductive wires and vias within the second BEOL region 109 can provide discrete electrical pathways from the second contacts on the second source region 111, second drain region 112 and second gate structure 115 (not shown) to the bonded surfaces 180.

As mentioned above, the first chip 151 can be flipped relative to and stacked on the second chip 101. Optionally, the first transistor 161 in the first chip 151 can be aligned above the second transistor 110A (or alternatively the second transistor 110B) in the second chip 101. Optionally, the first transistor 160 and the second transistor 110A (or alternatively the second transistor 110B) can further be electrically connected via electrical pathways extending through the second dielectric material layers 107 and the first dielectric material layers 157. For example, at the bonded surfaces 180, one or more first vias 195 (which extend through the last metal level (Mx) in the first BEOL region 159 of the first chip 151, 251 and which is/are ends to electrical pathway(s) to the first source region 161, to the first drain region 162, and/or to the first gate structure 165 (not shown)) can be aligned vertically with and bonded to one or more second vias 145 (which extend through the last metal level (Mx) in the second BEOL region 109 of the second chip 101 and which is/are end(s) to electrical pathway(s) to the second source region 111, to the second drain region(s) 112, and/or to the second gate structure(s) 115 (not shown)). In some embodiments, such electrical pathways can be established to form a circuit 130 including the first transistor 150 on the first chip 151 and the second transistor 110A or 110B on the second chip 101 electrically connected in parallel, as illustrated, or alternatively in series.

Referring to FIGS. 2.1-2.9, also disclosed herein are method embodiments for forming the 3DIC structures described above and illustrated in FIGS. 1.1A-1.2B.

The methods can include forming a first chip (e.g., see first chip 151 in FIG. 2.1). Formation of the first chip 151 can begin with a first semiconductor-on-insulator structure. The first semiconductor-on-insulator structure can be, for example, a silicon-on-insulator (SOI) structure including: a first semiconductor substrate 152 (also referred to herein as a sacrificial semiconductor substrate); a first insulator layer 154 on the first semiconductor substrate 152; and a first semiconductor layer on the first insulator layer 154. FEOL first devices (including at least a first transistor 160) can be formed using the first semiconductor layer. Specifically, first isolation regions 155 can be formed in the first semiconductor layer to define a first active device region 156 and the first transistor 160 can be formed using the first active device region 156. For example, a first gate structure 165 (which has gate sidewall spacers) can be formed on the first active device region 156 adjacent a first channel region 163 (which is above a first body region 164) and first source and drain regions 161-162 can be formed in the first active device region 156 on either side of the first channel region 163 and first body region 164. Optionally, first metal silicide layers 168 can be formed on the first source and drain regions and/or on the first gate structure 165. Techniques for forming such a first transistor 160 are well known in the art and, thus, the details have been omitted from this specification in order to allow the reader to focus on the salient aspects of the disclosed embodiments. Conventional MOL and BEOL processing can then be performed so that first dielectric material layers 157 (including first dielectric material layer(s) in a first MOL region 158 and first dielectric material layers in a first BEOL region 159 on the first MOL region 158) cover the first transistor 160, so that first contacts extend through the first MOL region 158 to terminals of at least some FEOL first devices (including the source, drain and gate terminals of the first transistor 160), and so that, optionally, first conductive wires and vias in the first BEOL region 159 provide electrical pathways from at least some of the first contacts in the first MOL region 158 (e.g., the source and/or drain contacts on the first transistor 160) to the outermost surface of the first dielectric material layers 157.

The methods can include forming a second chip 101 (e.g., see second chip 101 in FIG. 2.2A or second chip 101 in FIG. 2.2B). Formation of the second chip 101 can begin with a second semiconductor-on-insulator structure. The second semiconductor-on-insulator structure can be, for example, an SOI structure including: a second semiconductor substrate 102; a second insulator layer 104 on the second semiconductor substrate 102; and a second semiconductor layer on the second insulator layer 104. Optionally, one or more FEOL second devices (e.g., MOSFET(s), BJT(s), diode(s), passive device(s), etc.) could be formed using the second semiconductor layer. For example, FEOL second devices, including a second transistor 110A (e.g., as in FIG. 2.2A) or a second transistor 110B (e.g., as in FIG. 2.2B), can be formed using the second semiconductor layer. In this case, second isolation regions 105, 205 can be formed in the second semiconductor layer to define a second active device region 106, 206 for the second transistor 110A or 110B. For example, to form the second transistor 110A, a second gate structure 115 (which has gate sidewall spacers) can be formed on the second active device region 106 adjacent a second channel region 113 (which is above a second body region 114) and second source and drain regions 111-112 can be formed in the second active device region 106 on either side of the second channel region 113 and the second body region 114. To form the second transistor 110B, a second gate structure 115 (which has gate sidewall spacers) can be formed on the second active device region 106 adjacent to a second channel region 113 (which is above a second body region 114). Second source and drain regions 111-112 can be formed in the second active device region 106 on either side of the second channel region 113 without extending completely through the second active device region 106 and, particularly, through the second body region 114 below. Additionally, a body contact region 116 can be formed in the second active device region 106 immediately adjacent to the second body region 114 and, for example, positioned laterally adjacent to (e.g., optionally laterally surrounded by) the second source region 111. Optionally, second metal silicide layers 118 can be formed on the second source region 111 (and adjacent body contact region 116, if present), on the second drain region 112 and/or on the second gate structure 115. Techniques for forming such a second transistor 110A or the second transistor 110B are well known in the art and, thus, the details have been omitted from this specification in order to allow the reader to focus on the salient aspects of the disclosed embodiments. Conventional MOL and BEOL processing can then be performed so that second dielectric material layers 107 (including second dielectric material layer(s) in a second MOL region 108 and second dielectric material layers in a second BEOL region 109 on the second MOL region 108) cover the FEOL second device(s) (e.g., including the second transistor 110A or 110B, if present), so that second contacts extend through the second MOL region 108 to terminals of at least some FEOL second devices (e.g., to source, drain and gate terminals of the second transistor 110A or 110B, if present), and so that, optionally, second conductive wires and vias within the second BEOL region 109 provide electrical pathways from some second contacts (e.g., from the source and/or drain contacts on the second transistor 110A or 110B, if present) to the outermost surface of the second dielectric material layers 107.

The methods can further include flipping the first chip 151 relative to the second chip 101 and stacking the first chip 151 on the second chip 101 so that outermost surfaces of the first dielectric material layers 157 (distal to FEOL first devices, including the first transistor 160) and the second dielectric material layers 107 (distal to FEOL second devices, including the second transistor 110A or 110B) are immediately adjacent to each other (see FIG. 2.3). It should be noted that, during BEOL processing on the first chip 151 and on the second chip 101, patterning of one or more first vias 195 and patterning of one or more second vias 145 can be performed so that, when the first chip 151 is flipped relative to and stacked on the second chip 101, first vias and second vias will be vertically aligned. Then, the outermost surfaces of the first dielectric material layers 157 and the second dielectric material layers 107 can be bonded together (see bonded outermost surfaces 180). Bonding techniques that will result in dielectric-to-dielectric bonding of adjacent dielectric materials (e.g., of the first and second dielectric material layers) and metal-to-metal bonding (e.g., copper-to-copper bonding) of the adjacent metal materials (e.g., of vertically aligned first and second vias) are well known in the art. Thus, a detailed discussion of such techniques has been omitted from this specification in order to allow the reader to focus on the salient aspects of the disclosed embodiments. However, those skilled in the art will recognize that such techniques typically rely on application of both pressure and relatively high heat.

The methods can further include removing the first semiconductor substrate 152 to expose the first insulator layer 154 (see FIG. 2.4). Removal of the first semiconductor substrate 152 can be achieved, for example, using a grinding process or any other suitable process. Substrate grinding techniques are well known in the art and, thus, the details thereof have been omitted from this specification in order to allow the reader to focus on the salient aspects of the disclosed embodiments.

The methods can further include forming an opening 301 that extends through the first insulator layer 154 to the first active device region 156 at the first body region 164 (see FIG. 2.5). The opening 301 can be formed using, for example, conventional lithographic patterning and etch techniques.

Optionally (e.g., when forming the 3DIC structure 100.1B of FIG. 1.1B or the 3DIC structure 100.2B of FIG. 1.2B), an additional semiconductor layer 175 can be formed so as to cover the surface of the first body region 164 at the bottom of the opening (i.e., to fill a lower section of the opening) (see FIG. 2.6). An epitaxial growth or deposition process can be performed so that a monocrystalline or polycrystalline semiconductor layer is grown or deposited on the exposed semiconductor surface at the bottom of the opening 301. The semiconductor material of the additional semiconductor layer 175 can be the same semiconductor material as that used for the first active device region 156 or a different semiconductor material. For example, the semiconductor material of the additional semiconductor layer 175 can be monocrystalline or polycrystalline silicon, silicon germanium, silicon carbide, or any other suitable monocrystalline or polycrystalline semiconductor material. Additionally, additional semiconductor layer 175 can further be doped (e.g., in situ doped during epitaxial growth) or otherwise doped (e.g., via a dopant implantation process) so as to have a different type conductivity than the first body region 164. That is, if the first body region 164 is a P-type body region (e.g., in the case of an N-type MOSFET (NFET), then the additional semiconductor layer 175 can be doped so as to be an N-type additional semiconductor layer; whereas if the first body region 164 is an N-type body region (e.g., in the case of a P-type MOSFET (PFET), then the additional semiconductor layer 175 can be doped so as to be a P-type additional semiconductor layer. Alternatively, the additional semiconductor layer 175 can be doped (e.g., in situ doped during epitaxial growth) or otherwise doped (e.g., via a dopant implantation process) so as to have the same type conductivity as the first body region 164, but at a different conductivity level (e.g., at a higher conductivity level).

For purposes of illustration, the remaining processes are described below and illustrated in the figures without the optional additional semiconductor layer 175. It should be understood that these same processes could be performed with respect to the structure shown in FIG. 2.6 that includes the additional semiconductor layer 175.

The methods can include forming a contact 170 (see FIG. 2.7). For example, a metallic liner 171 can be conformally deposited over the partially completed structure so as to line the opening (or upper section thereof above an additional semiconductor layer 175, if applicable). The metallic liner 171 can include one or more relatively thin metal or metal alloy layers, conformally deposited using a thin film deposition technique such as atomic layer deposition (ALD) or any other suitable thin film deposition technique. In some embodiments, the metallic liner 171 can include a metallic barrier layer (e.g., TiN layer, a WN layer, a tantalum nitride (TaN) layer, or a layer of any other suitable metal or metal alloy that can provide a diffusion barrier). One or more layers of metallic fill material 172 can subsequently be deposited (e.g., by chemical vapor deposition (CVD) or any other suitable deposition technique) on the metallic liner 171 so as to fill the opening. The metallic fill material 172 could be W or Ti. Alternatively, the metallic fill material can be W/Ti, Au, Ni/Au, Ti/Pt/Au, or any other suitable metallic fill material(s). The portion of the metallic fill and liner materials above the first insulator layer 154 can subsequently be patterned (e.g., using conventional lithographic patterning and etch techniques) such that the resulting contact 170 has a first portion within the opening 301 and a second portion on the first portion. Optionally, this patterning process can be performed such that the second portion is wider than the first portion (e.g., so that the contact 170 is T-shape (as illustrated)).

The methods can further include forming an additional first insulator layer 190 on the first insulator layer 154 and positioned laterally adjacent to the second portion of the contact 170 (see FIG. 2.8). The additional first insulator layer 190 can, for example, be deposited by thermal oxide deposition, chemical vapor deposition (CVD), or any other suitable insulator deposition process. Optionally, the top surface of the additional first insulator layer 190 can be polished (e.g., using a chemical mechanical polishing (CMP) process) and/or etched back to expose the contact 170.

Alternatively, instead of forming the additional first insulator layer 190 after contact 170 formation. The additional first insulator layer 190 could be performed prior to formation of the contact opening. The contact opening could be formed so that it extends through the additional first insulator layer 190 and first insulator layer 154. Optionally, the opening could be formed so that it is narrower within the first insulator layer as compared to the additional first insulator layer. Optionally, the additional semiconductor layer 175 could be formed at the bottom of the opening.

Then, the contact 170 could be formed. In this case, the metallic liner 171 will also line vertical surfaces of the additional first insulator layer 154 within the opening (e.g., to prevent electromigration of metal into the additional first insulator layer 154).

Additional processing can include the formation of through oxide vias (TOVs) including source and drain vias. For example, via openings 391-392 can be formed (e.g., lithographically patterned and etched) such that they extend through the additional first insulator layer 190, through the first insulator layer 154, through first isolation regions 155 and into the first dielectric material layers 157 (particularly, through the first MOL region 158) to first conductive wires within the first metal level (M1) of the first BEOL region 159) (see FIG. 2.9). The via openings 391 and 392 can specifically be patterned and etched so that they extend to first conductive wires 181 and 182, respectively. The via openings 391-392 can optionally be lined with a barrier layer (not shown) (e.g., to prevent electromigration of metal into adjacent materials) and filled with metal or metal alloy layer(s) (e.g., copper using conventional plating or other suitable techniques) to form a source via 191 and a drain via 192, respectively (e.g., as shown in FIGS. 1.1A-2.1B). The source via 191 can extend to the first conductive wire 181 and can, thus, be electrically connected to the first source region 161 of the first transistor 160 and the second source region 111 of the second transistor 110A (or 110B) through electrical pathways in the first and second dielectric material layers. The drain via 192 can extend to the first conductive wire 182 and can, thus, be electrically connected to the first drain region 162 of the first transistor 160 and to the second drain region 112 of the second transistor 110A (or 110B) through different electrical pathways in the first and second dielectric material layers.

The method can further include additional processing to complete the 3DIC structure 100.1A of FIG. 1.1A, 100.1B of FIG. 1.1B, 100.2A of FIG. 1.2A, and 100.2B of FIG. 1.2B. This additional processing can include, but is not limited to, the formation of input/output pads on the top surface of the additional first insulator layer 190 (e.g., adjacent to the TOVs); formation of a passivation layer, etc.

In the structures and methods described above, the first semiconductor substrate 152 (also referred to as the sacrificial semiconductor substrate) and the second semiconductor substrate 102 can be monocrystalline semiconductor substrates (e.g., monocrystalline silicon (Si) substrates or substrates of any other suitable monocrystalline semiconductor material). For purposes of this disclosure, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material.

That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer. It should be noted that the monocrystalline semiconductor material of the first semiconductor substrate 152 and the second semiconductor substrate 102 can be the same or different.

In the structures and methods described above the first insulator layer 154, the additional first insulator 190, and the second insulator layer 104 can be oxide layers (e.g., silicon dioxide layers) or layers of any other suitable insulator material. The insulator material of these different insulator layers can be the same or different. The first semiconductor layer (and thereby the first active device region 156 of the first transistor 160) and the second semiconductor layer (and thereby the second active device region 106 of the second transistor 110A or 110B) can be monocrystalline semiconductor layers (e.g., monocrystalline Si layers or substrates of any other suitable monocrystalline semiconductor material). The monocrystalline semiconductor material of these two semiconductor layers can be the same or different and the same or different from the monocrystalline semiconductor material of the semiconductor substrate.

In the structures and methods described above, the first isolation regions 155 and the second isolation regions 105 can be STI regions. Each STI region can include a trench that extends through a semiconductor layer to an insulator layer. In each STI region the trench can be filled with one or more layers of isolation material. The isolation material(s) can include $SiO_2$, silicon nitride, silicon oxynitride, and/or any other isolation material suitable for use in an STI region.

In the structures and methods described above, the first transistor 160 and the second transistor 110A or 110B can, as mentioned above, be MOSFETs. These two MOSFETs can be two N-type MOSFETs (NFETs), two P-type MOSFETs (PFETs), an NFET and a PFET, or a PFET and an NFET, respectively. In an NFET the source and drain regions can have N-type conductivity at a relatively high conductivity level (e.g., the source and drain regions can be N+ regions), the body and channel regions can have P-type conductivity at a relatively low conductivity level (e.g., the body and channel regions can be P− regions), and a body contact region (if present) can have P-type conductivity at a relatively high conductivity level (e.g., the body contact region can be a P+ region). In a PFET the source and drain regions can have P-type conductivity at a relatively high conductivity level (e.g., the source and drain regions can be P+ regions), the body and channel regions can have N-type conductivity at a relatively low conductivity level (e.g., the body and channel regions can be N− regions), and a body contact region (if present) can have N-type conductivity at a relatively high conductivity level (e.g., the body contact region can be a N+ region). Furthermore, the gate structure (s) of the two MOSFETs can include a gate stack. The gate stack can include a gate dielectric layer (including one or more layers of gate dielectric material immediately adjacent to an active device region at a channel region) and a gate conductor layer (including one or more layers of gate conductor material) on the gate dielectric layer). The gate stack can further include gate sidewall spacers positioned laterally adjacent to the sidewalls of the gate stack so as to isolation the gate conductor layer from the adjacent source and drain regions. Gate sidewall spacers can include one or more layers of isolation material (e.g., silicon nitride, silicon dioxide, silicon oxynitride, or any other suitable gate side-wall spacer isolation material). Such gate structures can include, for example, gate-first polysilicon gate structures, gate-first metal gate structures or replacement metal gate structures, or any other suitable type of gate structure. Such gate structures are well known in the art and, thus, the details thereof have been omitted from this specification in order to allow the reader to focus on the salient aspects of the disclosed embodiments.

In the structures and methods described above, the first metal silicide layers 168 and the second metal silicide layers 118 can be a silicide of any suitable metal material. For example, each of these metal silicide layers could be a cobalt silicide layer, a nickel silicide layer, a tungsten silicide layer, a titanium silicide layer or a layer of any other suitable metal silicide material. Furthermore, these metal silicide layers can all be made of the same metal silicide or the first metal silicide layers, the second metal silicide layers and/or the local interconnect could be made of different metal silicide materials.

In the structures and methods described above, the MOL first and second contacts within the first and second MOL regions 158 and 108 can be, for example, tungsten contacts, cobalt contacts or contacts made with any other suitable MOL contact material. BEOL first and second conductive wires within the BEOL regions 159 can be made, for example, of aluminum, copper, and/or any other suitable BEOL metal materials. The first vias 195 and second vias 145 in the last BEOL metal levels (Mx) on each chip can specifically be made of a metal material suitable for surface-to-surface bonding (e.g., copper). TOVs can further be made of the same metal as that used in the BEOL conductive wires and vias or a different metal (e.g., copper).

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising, "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first chip; and
a second chip, wherein the first chip is stacked on the second chip and includes:
first dielectric material layers adjacent to the second chip;
a first insulator layer;
a first transistor including a first active device region stacked vertically between the first dielectric material layers and the first insulator layer,
wherein, within the first active device region, the first transistor includes: a first source region; a first drain region; a first channel region; and a first body region on the first channel region,
wherein the first channel region and the first body region are positioned laterally between the first source region and the first drain region, and
wherein the first transistor further includes a first gate structure within the first dielectric material layers immediately adjacent to a surface of the first active device region at the first channel region; and
a contact to the first body region, wherein the contact is within the first insulator layer and immediately adjacent to another surface of the first active device region opposite the first gate structure.

2. The structure of claim 1, wherein the contact is within an opening that extends through the first insulator layer and includes a metallic liner lining the opening and metallic fill material on the metallic liner.

3. The structure of claim 1, wherein the contact includes a first portion in an opening that extends through the first insulator layer and a second portion above the first portion and wherein the first chip further includes:

an additional first insulator layer on the first insulator layer and positioned laterally adjacent to the second portion of the contact; and a source via and a drain via extending through the additional first insulator layer, through the first insulator layer, through first isolation regions, and into the first dielectric material layers to two conductive wires, wherein the two conductive wires are electrically connected to the first source region and the first drain region, respectively.

4. The structure of claim 1, wherein the second chip further includes:

a semiconductor substrate;

a second insulator layer on the semiconductor substrate;

a device on the second insulator layer; and second dielectric material layers on the second insulator layer and extending over the device, wherein a first outermost surface of the first dielectric material layers and a second outermost surface of the second dielectric material layers are bonded.

5. The structure of claim 4, wherein the device includes a second transistor having a floating body region.

6. The structure of claim 4, wherein the device includes a second transistor having a contacted body region.

7. The structure of claim 4, wherein the first dielectric material layers include first conductive wires and vias electrically connected to the first transistor and having at least one first via at the first outermost surface, wherein the second dielectric material layers include second conductive wires and vias electrically connected to the device and having at least one second via at the second outermost surface, and wherein the at least one first via and the at least one second via are bonded and the first transistor and the device are electrically connected.

8. A structure comprising:

a first chip; and a second chip, wherein the first chip is stacked on the second chip and includes:

first dielectric material layers adjacent to the second chip;

a first insulator layer; and a first transistor including a first active device region stacked vertically between the first dielectric material layers and the first insulator layer, wherein, within the first active device region, the first transistor includes: a first source region; a first drain region; a first channel region; and a first body region on the first channel region, wherein the first channel region and the first body region are positioned laterally between the first source region and the first drain region, wherein the first transistor further includes a first gate structure within the first dielectric material layers immediately adjacent to a surface of the first active device region at the first channel region, and wherein an opening extends through the first insulator layer to the first body region at another surface of the first active device region opposite the first gate structure;

an additional semiconductor layer within the opening immediately adjacent to the first body region; and a contact within the opening on the additional semiconductor layer.

9. The structure of claim 8, wherein the contact includes a metallic liner lining a section of the opening above the additional semiconductor layer and metallic fill material on the metallic liner.

10. The structure of claim 8, wherein the contact includes a first portion in a section of the opening above the additional semiconductor layer and a second portion above the first portion and wherein the first chip further includes:

an additional first insulator layer on the first insulator layer and positioned laterally adjacent to the second portion of the contact; and a source via and a drain via extending through the additional first insulator layer, through the first insulator layer, through first isolation regions, and into the first dielectric material layers to two conductive wires, wherein the two conductive wires are electrically connected to the first source region and the first drain region, respectively.

11. The structure of claim 8, wherein the second chip further includes:

a semiconductor substrate;

a second insulator layer on the semiconductor substrate;

a device on the second insulator layer; and second dielectric material layers on the second insulator layer and extending over the device, wherein a first outermost surface of the first dielectric material layers and a second outermost surface of the second dielectric material layers are bonded.

12. The structure of claim 11, wherein the device includes a second transistor having one of a floating body region and a contacted body region.

13. The structure of claim 8, wherein the additional semiconductor layer has one of:

a different type conductivity than the first body region; and a same type conductivity as the first body region at a different conductivity level.

14. The structure of claim 11, wherein the first dielectric material layers include first conductive wires and vias electrically connected to the first transistor and having at least one first via at the first outermost surface, wherein the second dielectric material layers include second conductive wires and vias electrically connected to the device and having at least one second via at the second outermost surface, and wherein the at least one first via and the at least one second via are bonded and the first transistor and the device are electrically connected.

15. A method comprising:

forming a first chip;

forming a second chip;

stacking the first chip on the second chip, wherein the first chip includes:

first dielectric material layers adjacent to the second chip;

a first insulator layer; and a first transistor between the first dielectric material layers and the first insulator layer, wherein the first transistor includes: a first source region; a first drain region; a first channel region; and a first body region on the first channel region, wherein the first channel region and the first body region are positioned laterally between the first source region and the first drain region; and a first gate structure between the first dielectric material layers and the first channel region;

forming an opening that extends through the first insulator layer to the first body region; and forming a contact within the opening.

16. The method of claim 15, further comprising, before the forming of the contact, forming an additional semiconductor layer in the opening immediately adjacent to the first body region.

17. The method of claim 15, wherein the forming of the contact includes:

lining the opening with a metallic liner; and filling the opening with metallic fill material on the metallic liner.

18. The method of claim 15, wherein the forming of the first-chip further includes:

providing a first semiconductor-on-insulator structure including: a first semiconductor substrate; the first insulator layer on the first semiconductor substrate; and a first semiconductor layer on the first insulator layer, and wherein the stacking of the first chip on the second chip includes: flipping the first chip relative to the second chip so that the first semiconductor substrate of the first chip.

19. The method of claim 18, further comprising, after the stacking and before the forming of the opening, removing the first semiconductor substrate to expose the first insulator layer.

20. The method of claim 19, wherein the contact is formed with a first portion in the opening and a second portion above the first portion and wherein the method further comprises:

forming an additional first insulator layer on the first insulator layer positioned laterally adjacent to the second portion of the contact; and forming a source via and a drain via extending through the additional first insulator layer, through the first insulator layer, through first isolation regions, and into the first dielectric material layers to two conductive wires, wherein the two conductive wires are electrically connected to the first source region and the first drain region, respectively.

* * * * *